(12) United States Patent
Long et al.

(10) Patent No.: US 8,492,183 B2
(45) Date of Patent: Jul. 23, 2013

(54) MANUFACTURING METHOD OF FILM PATTERN OF MICRO-STRUCTURE AND MANUFACTURING METHOD OF TFT-LCD ARRAY SUBSTRATE

(75) Inventors: Chunping Long, Beijing (CN); Haoran Gao, Beijing (CN); Jigang Xu, Beijing (CN)

(73) Assignee: Boe Technology Co., Ltd., Beijing (CN)

( * ) Notice: Subject to any disclaimer, the term of this patent is extended or adjusted under 35 U.S.C. 154(b) by 53 days.

(21) Appl. No.: 12/855,752

(22) Filed: Aug. 13, 2010

(65) Prior Publication Data

US 2011/0039362 A1 Feb. 17, 2011

(30) Foreign Application Priority Data

Aug. 14, 2009 (CN) .......................... 2009 1 0091255

(51) Int. Cl.
*H01L 21/00* (2006.01)
(52) U.S. Cl.
USPC ................. 438/34; 438/98; 438/99; 438/694; 257/E21.211; 257/E21.414
(58) Field of Classification Search
USPC ....... 438/34, 99, 694; 257/E21.211, E21.025, 257/E21.414
See application file for complete search history.

(56) References Cited

U.S. PATENT DOCUMENTS

| | | | |
|---|---|---|---|
| 2006/0145146 A1* | 7/2006 | Suh et al. | 257/40 |
| 2006/0170733 A1* | 8/2006 | Lee et al. | 347/54 |
| 2006/0197079 A1* | 9/2006 | Suh et al. | 257/40 |
| 2006/0213870 A1* | 9/2006 | Waldrop et al. | 216/92 |
| 2007/0132825 A1* | 6/2007 | Lee et al. | 347/102 |
| 2009/0061167 A1* | 3/2009 | Nishida et al. | 428/195.1 |
| 2009/0283141 A1* | 11/2009 | Bentzen et al. | 136/256 |

FOREIGN PATENT DOCUMENTS

| | | |
|---|---|---|
| CN | 1400106 A | 3/2003 |
| CN | 101034262 A | 9/2007 |
| WO | 2008/129250 A2 | 10/2008 |

* cited by examiner

*Primary Examiner* — Charles Garber
*Assistant Examiner* — Abdulfattah Mustapha
(74) *Attorney, Agent, or Firm* — Ladas & Parry LLP

(57) ABSTRACT

A method of forming a film pattern with micro-pattern and a method of manufacturing a thin film transistor liquid crystal display (TFT-LCD) array substrate are provided. The method of manufacturing the film pattern with micro-pattern comprises: depositing a thin film on a substrate; jetting or dropping etchant on the thin film with a predetermined etching pattern by an inkjet print device; etching the thin film by the etchant; and cleaning the thin film to form a film pattern on the substrate.

18 Claims, 8 Drawing Sheets

A1 - A1

A2 - A2

A3 - A3

MANUFACTURING METHOD OF FILM PATTERN OF MICRO-STRUCTURE AND MANUFACTURING METHOD OF TFT-LCD ARRAY SUBSTRATE

BACKGROUND

Embodiments of the invention relate to a method of forming a film pattern and a method of manufacturing a thin film transistor liquid crystal display (TFT-LCD) array substrate.

In these years, the demand for electronic products has been rapidly increasing. Semiconductor manufacture technology plays a great role to promote the development of various electronic products. For example, chips and display screens employed in the electronic products such as mobile, computer, media player, game machine and the like are all produced by means of the semiconductor manufacture technology. Typically, the semiconductor manufacture technology employs film deposition process and patterning process to form three dimensional devices such as field effect transistor, diode, memory, thin film transistor and the like on a substrate.

Hereinafter, the conventional manufacture process employed in the semiconductor manufacture technology will be described by taking thin film transistor liquid crystal display (TFT-LCD) array substrate as an example. Firstly, a gate metal film is deposited on a glass substrate by a sputtering method, and a gate line and a gate electrode of the thin film transistor are formed by a photolithography process performed with an exposure machine and an etching process performed with an etching machine; next, a gate insulating film, a semiconductor film and a doped semiconductor film are sequentially deposited by a plasma enhanced chemical vapor deposition (PECVD) method, and an active layer of the thin film transistor is formed by a photolithography process performed with an exposure machine and an etching process performed with an etching machine; next, a source/drain metal film is deposited by a sputtering method, and a data line, a source electrode and a drain electrode of the thin film transistor are formed by a photolithography process performed with an exposure machine and an etching process performed with an etching machine; then, a passivation film is deposited by a PECVD method, and a via hole in the passivation layer is formed by a photolithography process performed with an exposure machine and an etching process performed with an etching machine; and finally, a transparent conductive film is deposited by a sputtering method, and a pixel electrode is formed by a photolithography process performed with an exposure machine and an etching process performed with an etching machine. In the above photolithography processes and etching processes, the film that has been deposited and is to be patterned is applied with a photoresist layer thereon and placed into an exposure machine, and a mask plate with a certain pattern is installed on the exposure machine so that only a portion of incident light is irradiated on the photoresist layer through the mask plate, i.e., the photoresist layer is exposed. Then, a photoresist pattern, which has the same pattern as that of the mask plate, is formed by developing. Finally, the film unprotected by the photoresist pattern is etched away by a dry etching method or a wet etching method with an etching machine, so that a film pattern is formed. The above process is performed many times to manufacture a semiconductor device. Typically, 20-40 mask plates are needed to manufacture a chip, that is, the above process is repeatedly performed for 20-40 times. As to the manufacture of the TFT-LCD array substrate, 3-6 mask plates are needed.

Apparatuses for film deposition and patterning generally comprise a film coating machine (such as a PECVD machine and a sputtering machine), an exposure machine, an etching machine (such as a wet etching machine and a dry etching machine) and the like. These apparatuses are expensive, and many kinds of apparatuses are necessarily employed in order to form a single structural layer. Therefore, the manufacture cost in the conventional manufacture process is high. In addition, the conventional manufacture process further has the disadvantages, such as long production period, high cross-contamination risk and low yield.

Recently, an inkjet print technology is employed to manufacture a color filter substrate of liquid crystal display. Since the structure and the employed materials of a TFT-LCD array substrate are different from those of a color filter substrate, the TFT-LCD array substrate is still manufactured by the conventional photolithography process and the etching process. Therefore, the manufacture process of the TFT-LCD array substrate still has the disadvantages of expensive apparatuses, high manufacture cost, long production period and low yield.

SUMMARY OF THE INVENTION

According to an embodiment of the invention, a method of forming a film pattern with micro-pattern is provided in the invention. The method of manufacturing the film pattern with micro-pattern comprises: Step 11 of depositing a thin film on a substrate; Step 12 of jetting or dropping etchant on the thin film with a predetermined etching pattern by an inkjet print device; Step 13 of etching the thin film by the etchant; and Step 14 of cleaning the thin film to form a film pattern on the substrate.

According to another embodiment of the invention, a method of forming a film pattern with micro-pattern is provided in the invention. The method of manufacturing the film pattern with micro-pattern comprises: Step 21 of jetting or dropping solution for forming the film pattern in a predetermined ink pattern on a substrate by an inkjet print device; and Step 22 of drying the solution to form the film pattern on the substrate.

According to still another embodiment of the invention, a method of manufacturing a thin film transistor liquid crystal display (TFT-LCD) array substrate is provided in the invention, wherein a plurality of structural layers of the array substrate are formed on a substrate by an inkjet print device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 2b is a sectional view taken along line A1-A1 in FIG. 2a;

FIG. 3b is a sectional view taken along line A2-A2 in FIG. 3a;

FIG. 4b is a sectional view taken along line A3-A3 in FIG. 4a;

FIG. 5b is a sectional view taken along line A4-A4 in FIG. 5a;

FIG. 6b is a sectional view taken along line A5-A5 in FIG. 6a;

DESCRIPTION OF THE EMBODIMENTS

Hereinafter, embodiments of the invention will be described in detail with reference to the accompany drawings. It should be noted that, for the purpose of clearly clarify the invention, the thickness of thin films and the sizes of regions in the accompanying drawings are not depicted according to the scale of a real device.

A first embodiment of a method of forming a film pattern of micro-structure according to the invention comprises:

Step 11, depositing a thin film on a substrate;

Step 12, jetting or dropping etchant on the thin film with a predetermined etching pattern by an inkjet print device;

Step 13, etching the thin film by the etchant; and

Step 14, cleaning the thin film to form a film pattern on the substrate.

Figure 1A:
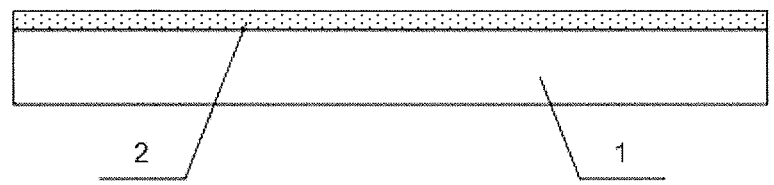
FIG. 1*a*-1*c* are schematic views showing a first embodiment of a manufacture process according to the invention.
Figure 1B:
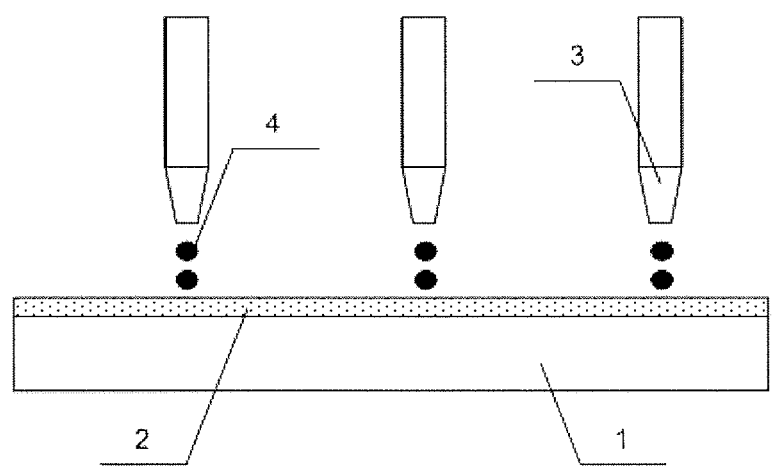
Figure 1C:
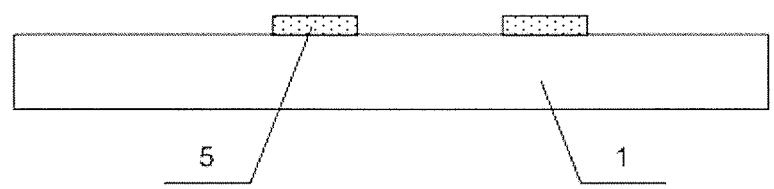

FIGS. 1a to 1c are schematic views showing the first embodiment of the manufacture process according to the invention. Firstly, a thin film 2 is deposited on a substrate 1 by a physical or chemical deposition method, as shown in FIG. 1a. Then, etchant 4 is jetted or dropped onto the thin film 2 by an inkjet print device 3 with a predetermined etching pattern, as shown in FIG. 2b. Finally, after the etching of the etchant 4 upon the thin film 2 is completed, a film pattern 5 is formed on the substrate 1 by a washing process, as shown in FIG. 1c.

In this embodiment, the thin film 2 may be a metal film, an insulating film or a semiconductor film; the physical deposition method to deposit the thin film 2 may be a magnetron sputtering method, a vacuum sputtering method, a thermal evaporation method and the like; the chemical deposition method to deposit the thin film 2 may be a plasma enhanced chemical vapor deposition (PECVD) method and the like; and the substrate 1 may be a transparent substrate such as a glass substrate, a quartz substrate and the like, or a flexible substrate or a semiconductor substrate.

In this embodiment, the inkjet print device 3 comprises a set of inkjet print heads and a set of control systems. Each of the inkjet print heads comprises a nozzle and a control device for controlling the nozzle to open or close. The ink droplets jetted or dropped by the nozzle of the print head is controlled by the Drop-on-Demand signal. The inkjet print device 3 in this embodiment jets or drops the ink droplets in various manners, such as piezoelectric manner, thermal bubble manner, electro-mechanical manner, ultrasonic manner, electro-pneumatic manner, electrostatic manner, magnetostriction manner or other inkjet print manners well-known in the related field. The inkjet print manner and the parameter configuration of the inkjet print device have a direct impact on the distribution of the ink droplets and the thickness and width of the film pattern to be formed. For example, with respect to the piezoelectric manner, the movement of the ink droplets is determined by the velocity at the time the droplets are jetted, the air friction and the kinetic energy of the droplets. The movement traces of the droplets are easily distorted or deviated if the kinetic energy at the time the droplets are jetted is relatively low, and thus the landing error of the ink droplets is caused. Therefore, the inkjet print device in the piezoelectric manner is adapted to handle the materials with a relatively low viscosity and form the film patterns of a relatively large size. In addition, with respect to the electrostatic manner, the velocity of the droplets is accelerated by the electric field between the nozzle and the substrate so that the kinetic energy of the droplets can be increased, and thus the movement traces of the droplets are maintained and the line of fine structure can be easily formed. Therefore, the inkjet print device in the electrostatic manner is adapted to handle the materials with a relatively high viscosity and form the film patterns of a relatively small size. In addition, with respect to the ultrasonic manner, the ultrasonic wave from a generator is concentrated on the liquid surface so that the ink droplet is jetted, and the ultrasonic manner is a non-contact and non-nozzle inkjet print manner. Therefore, the inkjet print device in the ultrasonic manner is adapted to handle the materials with a relatively high viscosity and form the film patterns of a relatively small size and does not have the problem of nozzle blockage. When the method of manufacturing the film pattern of micro-structure in this embodiment is applied to manufacture a TFT-LCD array substrate, a diode or other device of an integrated circuit, the print manner, the print head and the nozzle should be appropriately selected according to the structure, the size and the employed material of the film pattern to be formed. For example, since the film with a relatively large thickness consumes more ink than the film with a relatively small thickness, the print head with a relatively large opening or nozzle is employed in forming the film with a relatively large thickness. In addition, the print head with a relatively small opening or nozzle is employed in forming the film pattern with a small feature size. Furthermore, when an insulating film pattern is formed, the print head capable of alleviating the pinhole defect in the formed insulating film pattern is preferably employed, and a drop intersection control manner is also preferably employed. In this embodiment, the diameter of the nozzle is 5 μm~100 μm.

In this embodiment, each print head may be installed in a single print cartridge, or a plurality of print heads may be installed in a single print cartridge in a predetermined arrangement. Each print head may be connected with one or more ink storage can. When the inkjet print is performed, one or more print heads may be employed as long as the droplets jetted or dropped from different print heads are not overlapped with each other.

In this embodiment, the etchant 4 may be a kind of corrosive liquid or a kind of corrosive paste, for example, in the form of colloid. The physical and chemical properties of the etchant have a great influence on the film pattern to be formed (such as the thickness or size thereof). The concerned physical and chemical properties of the etchant typically comprise viscosity, surface tension and wettability. If the viscosity of the etchant is too high, a large portion of the kinetic energy of the droplet provided by the print head in a piezoelectric manner, an ultrasonic manner or an electrostatic manner is dissipated by the high viscosity, and thus an ink droplet may not be jetted from the nozzle. If the viscosity of the etchant is too low, the etchant is not suitable to form the film pattern of a small size. Generally, the etchant with high viscosity is used to form the film pattern with a fine structure; in this case, however, it is necessary to prevent the nozzle of the print head from being blocked and prevent the properties of the etchant from being thermo-chemically changed. From the above, the viscosity parameter of the etchant is selected according to the material and thickness of the film to be etched and the size of the film pattern to be formed; therefore in this embodiment, the viscosity of the etchant is smaller than 20 mPa·s. Next, the surface tension is discussed. Surface tension mainly influences the shape formed by the droplets jetted or dropped on the substrate and reflects the affinity between the substrate and the ink droplets. Generally, such affinity can refer to hydrophobicity or hydrophilicity. Appropriate surface tension between the etchant and the substrate is helpful to uniformly distribute the etchant on the substrate and form the fine film pattern; therefore, in this embodiment, the surface tension of the etchant is 20 mN/m~400 mN/m. Finally, the wettability is discussed. Wettability reflects the wetting behavior between the ink droplet and the nozzle and mainly influences the size and shape of the droplets and the ink jetting process. Wettability generally can be reflected with a wettability contact angle. In this embodiment, the wettability contact angle is about 45 degree~90 degree.

In this embodiment, the size of etching pattern formed by the inkjet print device is smaller than that of the real etching pattern to be formed. The etchant dropped on the substrate trends to expand because of the surface tension of the etchant, and thus it is necessary to leave an expanding region for the etchant. The viscosity, surface tension and wettability contact angle of corrosive liquid are all different from those of corrosive paste, so the expanding degree of corrosive liquid on the substrate is different from that of corrosive paste. Generally, corrosive liquid has a large surface tension (about several hundreds mN/m) and a small wettability contact angle (about 45 degree~60 degree) while corrosive paste has a small surface tension (about several tens mN/m) and a large wettability contact angle (about 60 degree~90 degree), and therefore the expanding degree of corrosive liquid is larger than that of corrosive paste. For example, the expanding degree of corrosive liquid is about 30 μm, and the expanding degree of corrosive paste is about 10 μm. In this embodiment, the distance between the etching pattern edge and the corresponding film pattern edge is about 30 μm~50 μm when corrosive liquid is used as the etchant, and the distance between the etching pattern edge and the corresponding film pattern edge is about 10 μm~30 μm when corrosive paste is used as the etchant. That is, in this embodiment, the film pattern to be formed and the etching pattern initially formed by the etchant are complementary patterns but have a distance of 30 μm~50 μm or 10 μm~30 μm between the edges.

In this embodiment, during etching the thin film with the etchant, the substrate may be heated to 30° C.~80° C. to accelerate the etching process. Such heating process may be performed by a laser heating method, an infrared heating method, or a resistance heating method. In addition, in this embodiment, the deionized water may be used to wash and remove the etchant.

Hereinafter, the first embodiment of the method of manufacturing the film pattern of micro-structure according to the invention is applied to manufacture a TFT-LCD array substrate. It should be noted that, the etchant may be jetted on each thin film by the print head in a piezoelectric manner, an electrostatic manner, an ultrasonic manner, a thermal bubble manner and the like, the material of the nozzle can stand the corrosiveness effect of the used corrosive liquid or corrosive paste, and the diameter of the nozzle is about 5 μm~100 μm. During etching each thin film by the corrosive liquid or corrosive paste, the substrate may be heated to 30° C.~80° C. to accelerate the etching process.

Figure 2A:
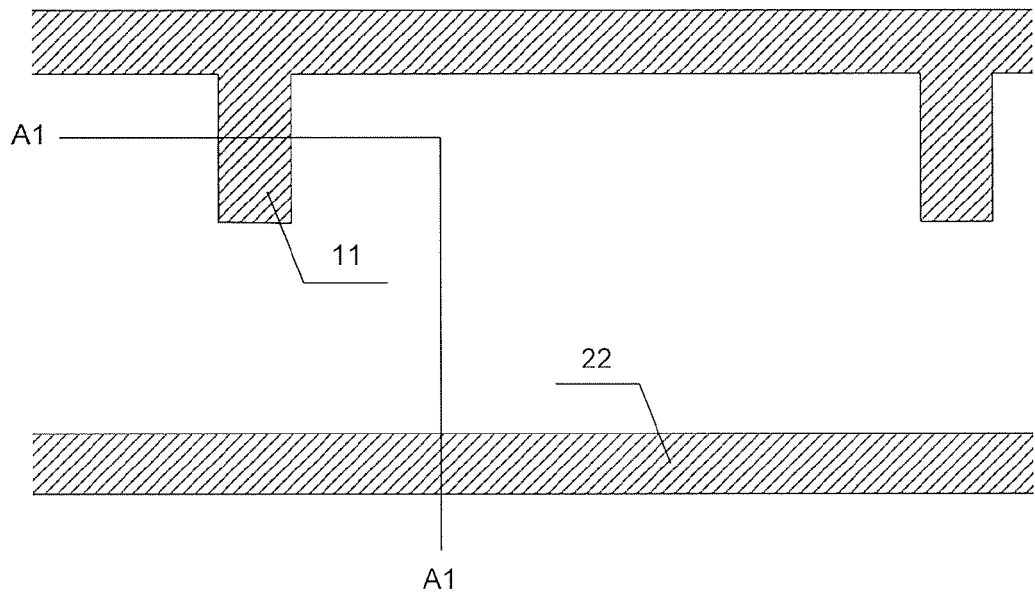
FIG. 2*a* is a schematic view after a gate line and a gate electrode are formed in a TFT-LCD array substrate by the first embodiment of the manufacture process according to the invention.
Figure 2A:
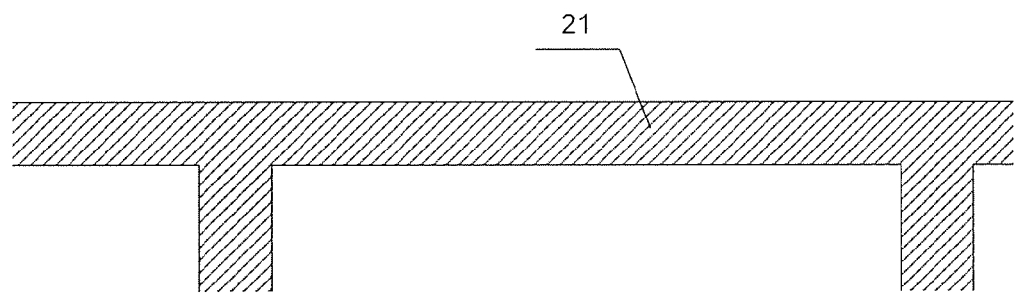
Figure 2B:
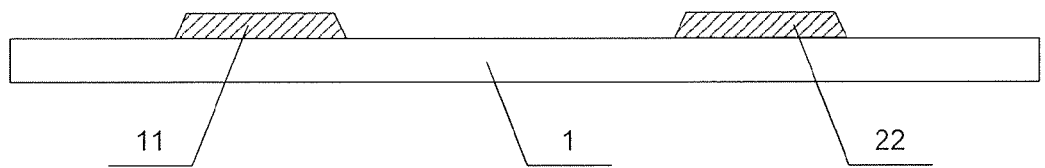

FIG. 2*a* is a schematic view after a gate line and a gate electrode are formed in a TFT-LCD array substrate by the first embodiment of the manufacture process according to the invention, and FIG. 2*b* is a sectional view taken along line A1-A1 in FIG. 2*a*.

As shown in FIG. 2*a* and FIG. 2*b*, a gate metal film is deposited on the substrate 1 by a magnetron sputtering method, a vacuum sputtering method or a thermal evaporation method. The gate metal film may be formed of a metal such as Ag, Cu, Au, Al, Mo and Pt or any alloy thereof. First etchant is jetted by the inkjet print device to form a first etching pattern on the gate metal film. The first etchant may be corrosive liquid or corrosive paste. The corrosive liquid comprises corrosive solution capable of etching the gate metal film, such as nitric acid, hydrochloric acid, sulfuric acid or a mixture thereof. The corrosive paste comprises a component capable of etching the gate metal film. After the etching is completed, the corrosive liquid or paste is washed away by the deionized water so that a gate electrode 11, a gate line 21 and a storage electrode 22 are formed on the substrate. In the above process, the first etching pattern formed by the first etchant on the gate metal film and the film pattern of the gate electrode 11, the gate line 21 and the storage electrode 22 are complementary patterns, that is the gate electrode 11, the gate line 21 and the storage electrode 22 are formed in the region other than where the first etchant exists. Because of the surface tension of the first etchant, the first etchant is expanded on the substrate 1, and therefore the first etching pattern is smaller than the actively etched region. If corrosive liquid is used as the first etchant, the distance from the edge of the first etching pattern to the corresponding edge of the gate electrode 11, the gate line 21 and the storage electrode 22 is about 30 μm~50 μm; if corrosive paste is used as the first etchant, the distance from the edge of the first etching pattern to the corresponding edge of the gate electrode 11, the gate line 21 and the storage electrode 22 is about 10 μm~30 μm.

The gate line formed in a TFT-LCD array substrate generally has a width of about several tens micron (such as 10 μm~35 μm). In view of the expanding degree of the first etchant, the efficiency of the inkjet print device and the structure of the gate line, the following parameters are preferably employed in this embodiment. When corrosive liquid with a wettability contact angle of 45 degree~60 degree is employed, the inkjet print device preferably employs an electrostatic inkjet print head, the diameter of the nozzle preferably is 10 μm~40 μm, more preferably 20 μm, and in this case, the distance from the edge of the first etching pattern to the corresponding edge of the gate electrode, the gate line and the storage electrode is 35 μm±5 μm. When corrosive paste with a wettability contact angle of 60 degree ~90 degree is employed, the inkjet print device preferably employs an ultrasonic inkjet print head, the diameter of the nozzle preferably is 30 µm~60 µm, more preferably 40 µm, and in this case, the distance from the edge of the first etching pattern to the corresponding edge of the gate electrode, the gate line and the storage electrode is 15 µm±5 µm. An ultrasonic inkjet print head can alleviate the nozzle blockage caused by the ink and thus is adapted for high viscosity ink.

Figure 3A:
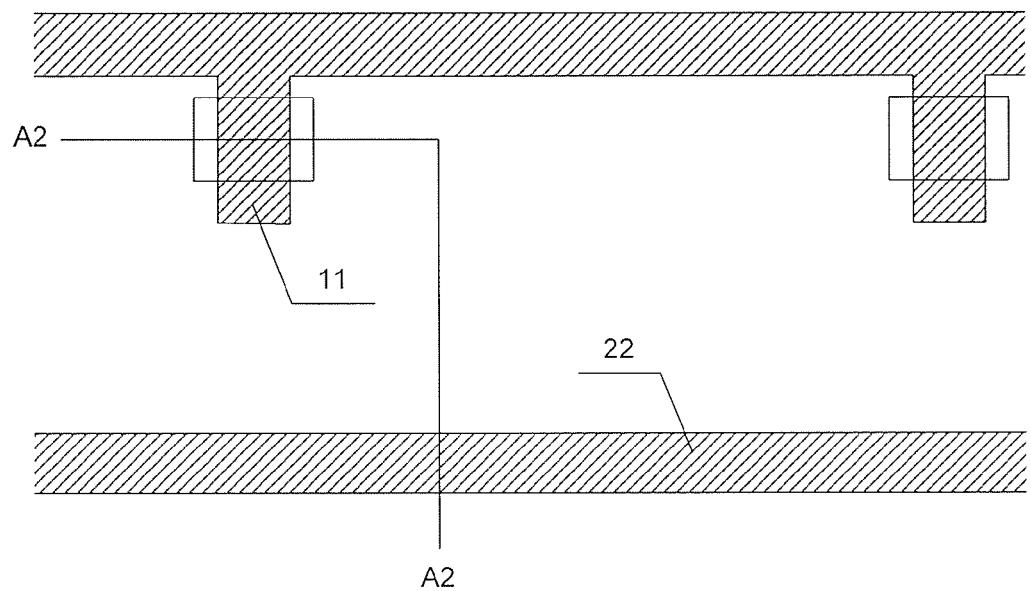
FIG. 3a is a schematic view after an active layer is formed in the TFT-LCD array substrate by the first embodiment of the manufacture process according to the invention.
Figure 3A:
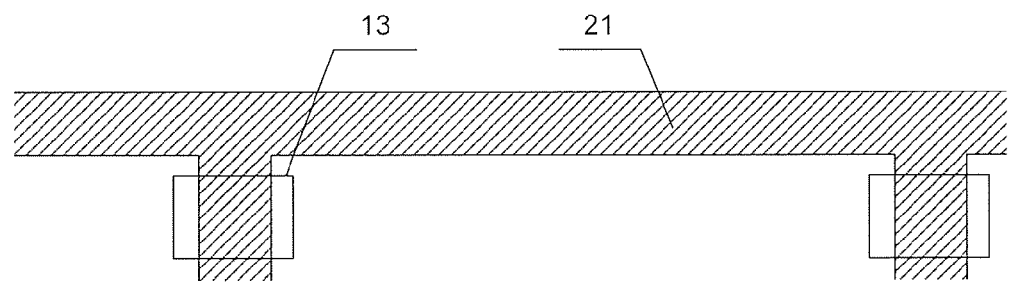
Figure 3B:
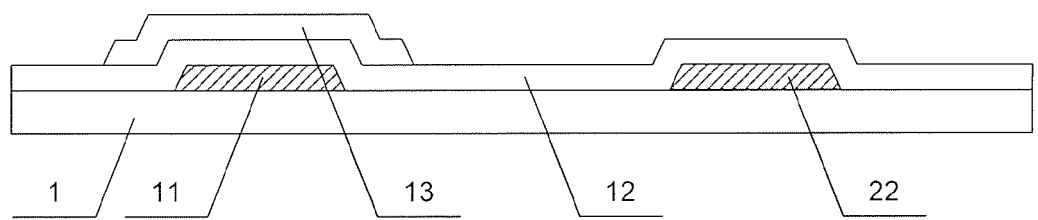

FIG. 3a is a schematic view after an active layer is formed in the TFT-LCD array substrate by the first embodiment of the manufacture process according to the invention, and FIG. 3b is a sectional view taken along line A2-A2 in FIG. 3a.

As shown in FIG. 3a and FIG. 3b, a gate insulating film and a semiconductor film are sequentially deposited on the substrate 1 formed with the gate electrode 11, the gate line 21 and the storage electrode 22 by a PECVD method. The gate insulating film may be formed by silicon dioxide, silicon nitride or a combination thereof. The semiconductor film may be formed by amorphous silicon. Second etchant is jetted by the inkjet print device to form a second etching pattern on the semiconductor film. The second etchant may be corrosive liquid or corrosive paste. The corrosive liquid comprises corrosive solution capable of etching the semiconductor film such as nitric acid, hydrochloric acid, sulfuric acid or a mixture thereof. The corrosive paste comprises a component capable of etching the semiconductor film. After the etching is completed, the corrosive liquid or paste is washed away by the deionized water so that an active layer 13 is formed on the substrate. The active layer 13 is formed on the gate insulating film 12 and positioned above the gate electrode 11. In this process, only the semiconductor film is etched to form the active layer, and the gate insulating film is completely remained. In addition, in the above process, the second etching pattern formed by the second etchant on the semiconductor film and the film pattern of the active layer 13 are complementary patterns, that is, the active layer 13 is formed in the region other than that of the second etchant. Because of the surface tension of the second etchant, the second etchant is expanded on the substrate 1, and therefore the second etching pattern is smaller than the actively etched region. If corrosive liquid is used as the second etchant, the distance from the edge of the second etching pattern to the corresponding edge of the active layer 13 is about 30 µm~50 µm; if corrosive paste is used as the second etchant, the distance from the edge of the second etching pattern to the corresponding edge of the active layer 13 is about 10 µm~30 µm.

In a TFT-LCD array substrate, each pixel region generally has a size of 270 µm×90 µm, and the active layer in each pixel region has a width of 30 µm~40 µm, a length of 40 µm~60 µm. Thus, the actively etched region is about 240 µm×45 µm. In view of the expanding degree of the second etchant, the efficiency of the inkjet print device and the structure of the active layer, the following parameters are preferably employed in this embodiment. Corrosive paste with a wettability contact angle of 60 degree~90 degree is preferably used as the second etchant, the inkjet print device preferably employs an ultrasonic inkjet print head, the diameter of the nozzle preferably is 30 µm~60 µm, more preferably 40 µm, and in this case, the distance from the edge of the second etching pattern to the corresponding edge of the active layer is 15 µm±5 µm.

Figure 4A:
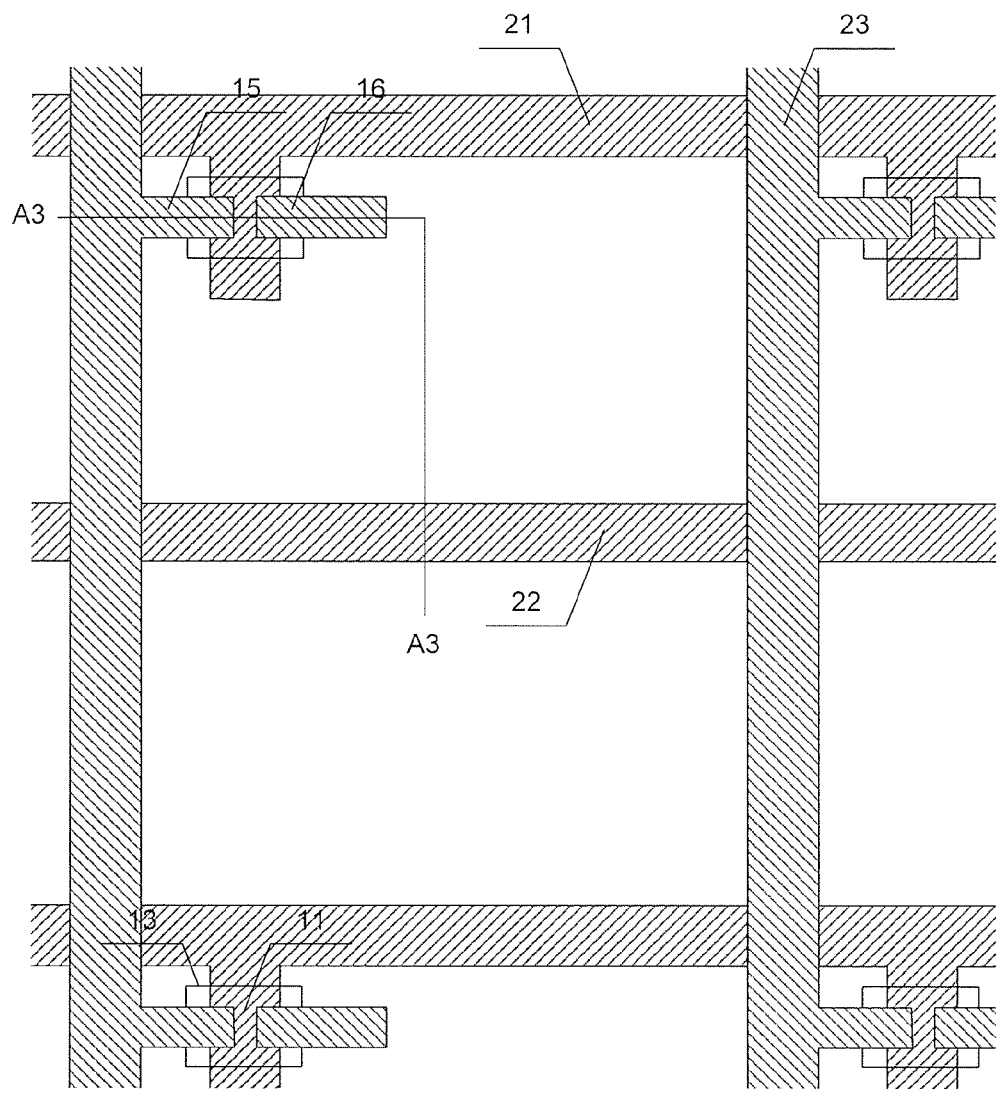
FIG. 4a is a schematic view after a data line, a source electrode and a drain electrode are formed in the TFT-LCD array substrate by the first embodiment of the manufacture process according to the invention.
Figure 4B:
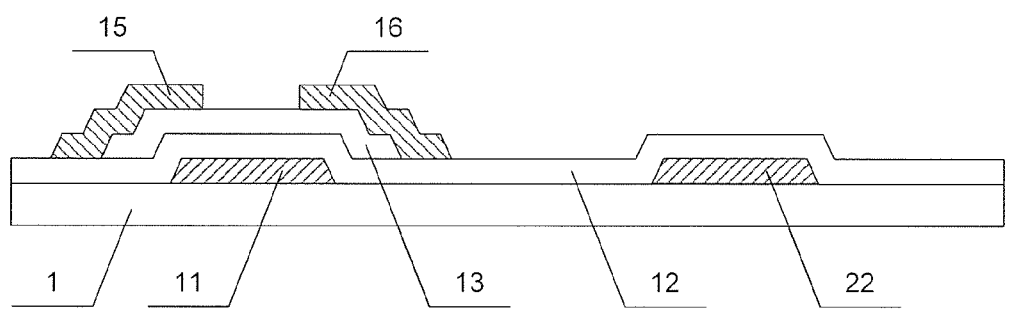

FIG. 4a is a schematic view after a data line, a source electrode and a drain electrode are formed in the TFT-LCD array substrate by the first embodiment of the manufacture process according to the invention, and FIG. 4b is a sectional view taken along line A3-A3 in FIG. 4a.

As shown in FIGS. 4a and 4b, a source/drain metal film is deposited on the substrate 1 by a magnetron sputtering method, a vacuum sputtering method or a thermal evaporation method. The source/drain metal film may be formed of a metal such as Ag, Cu, Au, Al, Mo or Pt or any alloy thereof. Third etchant is jetted by the inkjet print device to form a third etching pattern on the source/drain metal film. The third etchant may be corrosive liquid or corrosive paste. The corrosive liquid comprises corrosive solution capable of etching the source/drain metal film such as nitric acid, hydrochloric acid, sulfuric acid or a mixture thereof. The corrosive paste comprises a component capable of etching the source/drain metal film. After the etching is completed, the corrosive liquid or paste is washed away by the deionized water so that a data line 23, a source electrode 15 and a drain electrode 16 are formed on the substrate 1. One end of the source electrode 15 is positioned on the active layer 13, and the other end thereof is connected with the data line 23. One end of the drain electrode 16 is positioned on the active layer 13 and opposite to the source electrode 15. A TFT channel region is formed between the source electrode 15 and the drain electrode 16. In the above process, the third etching pattern formed by the third etchant on the source/drain metal film and the film pattern of the data line 23, the source electrode 15 and the drain electrode 16 are complementary patterns, that is, the data line 23, the source electrode 15 and the drain electrode 16 are formed in the region other than that of the third etchant. Because of the surface tension of the third etchant, the third etchant is expanded on the substrate 1, and therefore the third etching pattern is smaller than the actively etched region. If corrosive liquid is used as the third etchant, the distance from the edge of the third etching pattern to the corresponding edge of the data line 23, the source electrode 15 and the drain electrode 16 is about 10 µm~50 µm; if corrosive paste is used as the third etchant, the distance from the edge of the third etching pattern to the corresponding edge of the data line 23, the source electrode 15 and the drain electrode 16 is about 4 µm~6 µm.

The TFT channel region is formed between the source electrode and the drain electrode as described above, and the width and length of the channel have an important effect on the controlling characteristic and charging characteristic of the formed thin film transistor. Thus, the print head having small-sized nozzles is preferably employed to form the data line, the source electrode and the drain electrode so that the third etching pattern with fine structure can be formed. When corrosive paste with a wettability contact angle of 60 degree~90 degree is used as the third etchant, the inkjet print device preferably employs an ultrasonic inkjet print head, the diameter of the nozzle preferably is 5 µm~10 µm. In addition, the nozzles with different size may be employed in different regions, for example, the nozzle employed in the TFT channel region may have a diameter of 5 µm~10 µm, while the nozzle employed in other regions may have a diameter of 20 µm~40 µm.

Figure 5A:
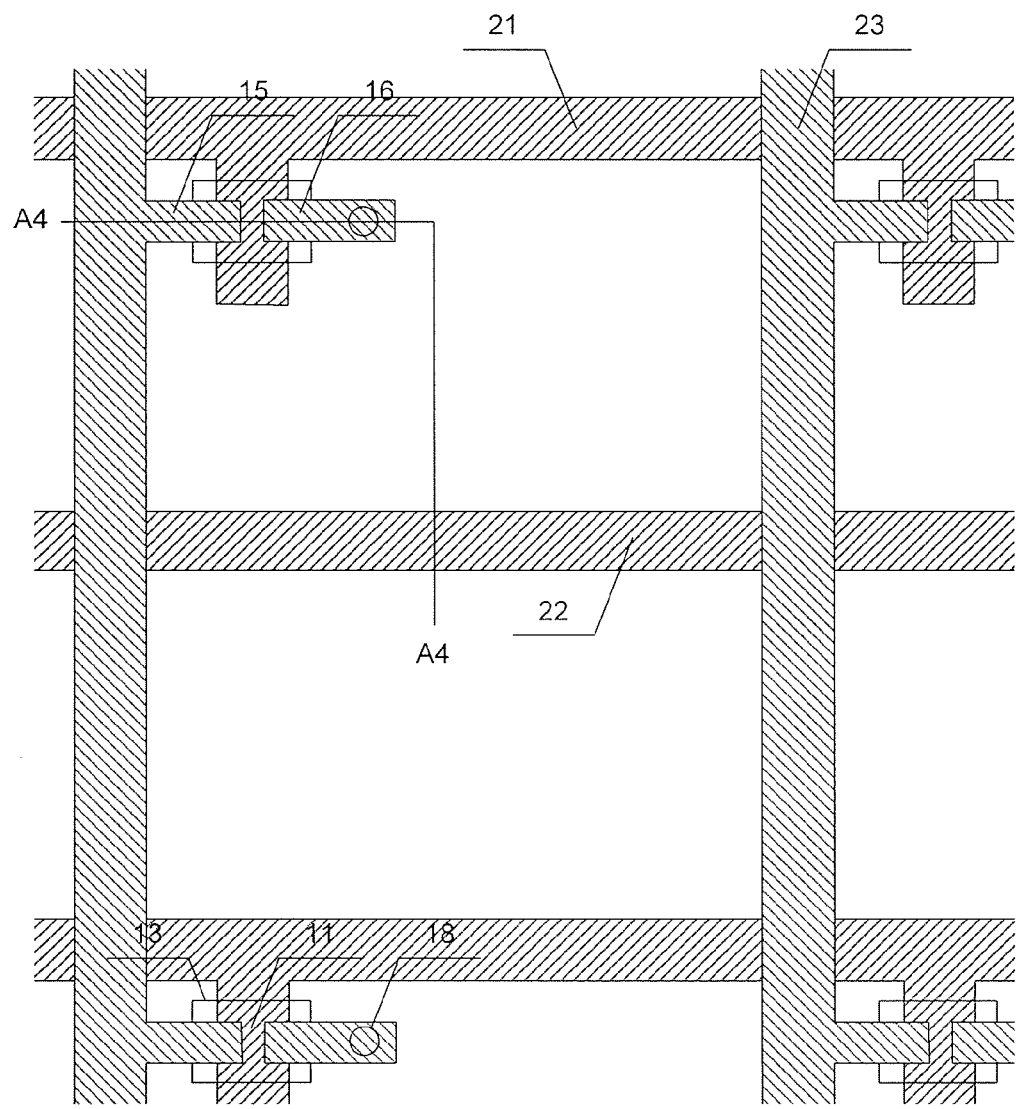
FIG. 5a is a schematic view after a passivation layer via hole is formed in the TFT-LCD array substrate by the first embodiment of the manufacture process according to the invention.
Figure 5B:
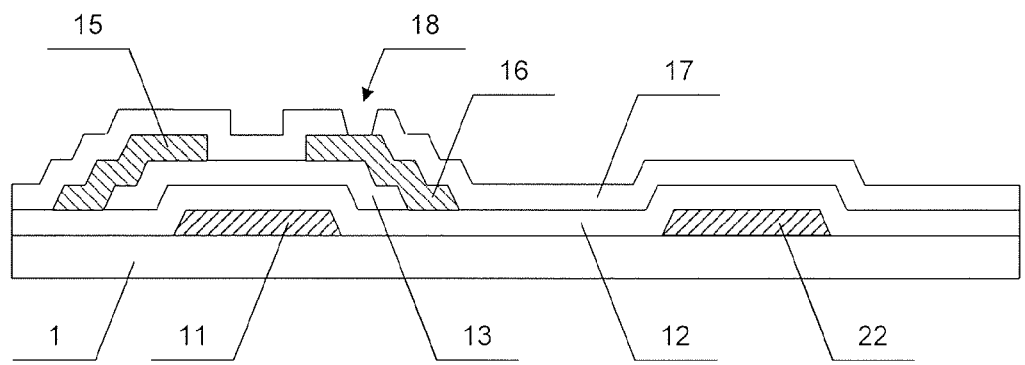

FIG. 5a is a schematic view after a passivation layer via hole is formed in the TFT-LCD array substrate by the first embodiment of the manufacture process according to the invention, and FIG. 5b is a sectional view taken along line A4-A4 in FIG. 5a.

As shown in FIGS. 5a and 5b, a passivation layer 17 is deposited on the substrate 1 with the data line 23, the source electrode 15 and the drain electrode 16 by a PECVD method. The passivation layer 17 may be formed by silicon nitride. Fourth etchant is jetted by the inkjet print device to form a fourth etching pattern on the passivation layer. The fourth etchant may be corrosive liquid or corrosive paste. The corrosive liquid comprises corrosive solution capable of etching the passivation layer such as nitric acid, hydrochloric acid, sulfuric acid or a mixture thereof. The corrosive paste comprises a component capable of etching the passivation layer. After the etching is completed, the corrosive liquid or paste is washed away by the deionized water so that a passivation layer via hole 18 is formed on the substrate 1. In the above process, the fourth etching pattern formed by the fourth etchant on the passivation layer and the pattern of the passivation layer via hole 18 are similar to each other, that is, the passivation layer via hole 18 is formed in the region of the fourth etchant. Because of the surface tension of the fourth etchant, the fourth etchant is expanded on the substrate 1, and therefore the fourth etching pattern is smaller than the actively etched region. If corrosive liquid is used as the fourth etchant, the distance from the edge of the fourth etching pattern to the corresponding edge of the passivation layer via hole 18 is about 8 μm~12 μm; if corrosive paste is used as the fourth etchant, the distance from the edge of the fourth etching pattern to the corresponding edge of the passivation layer via hole 18 is about 4 μm~6 μm.

The passivation layer via hole formed in the TFT-LCD array substrate generally has a diameter of 15 μm~25 μm. In view of the expanding degree of the fourth etchant, the efficiency of the inkjet print device and the structure of the passivation layer via hole, the following parameters are preferably employed in this embodiment. When corrosive liquid with a wettability contact angle of 45 degree~60 degree is employed, the inkjet print device preferably employs an electrostatic inkjet print head, the diameter of the nozzle preferably is 4 μm~6 μm, more preferably 5 μm. When corrosive paste with a wettability contact angle of 60 degree~90 degree is employed, the inkjet print device preferably employs an ultrasonic inkjet print head, the diameter of the nozzle preferably is 15 μm~25 μm, more preferably 20 μm.

Figure 6A:
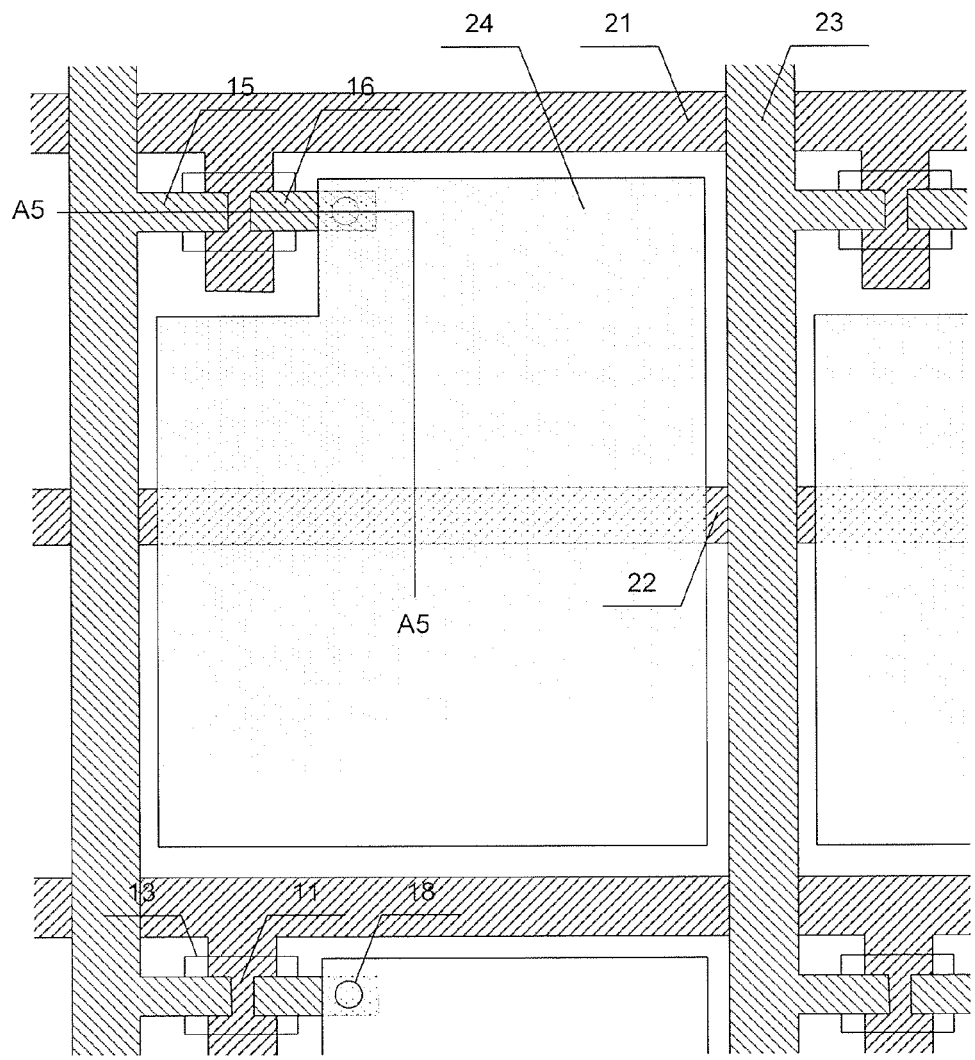
FIG. 6a is a schematic view after a pixel electrode is formed in the TFT-LCD array substrate by the first embodiment of the manufacture process according to the invention.
Figure 6B:
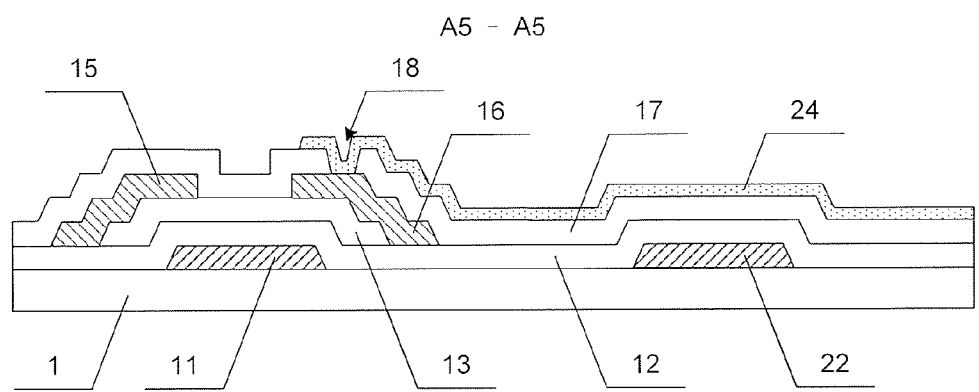

FIG. 6a is a schematic view after a pixel electrode is formed in the TFT-LCD array substrate by the first embodiment of the manufacture process according to the invention, and FIG. 6b is a sectional view taken along line A5-A5 in FIG. 6a.

As shown in FIGS. 6a and 6b, a transparent conductive film is deposited on the substrate 1 with the passivation layer via hole 18 by a magnetron sputtering method, a vacuum sputtering method or a thermal evaporation method. The transparent conductive film may be formed of indium tin oxide (ITO) or indium zinc oxide (IZO). Fifth etchant is jetted by the inkjet print device to form a fifth etching pattern on the transparent conductive film. The fifth etchant may be corrosive liquid or corrosive paste. The corrosive liquid comprises corrosive solution capable of etching the transparent conductive film such as nitric acid, hydrochloric acid, sulfuric acid or a mixture thereof. The corrosive paste comprises a component capable of etching the transparent conductive film. After the etching is completed, the corrosive liquid or paste is washed away by the deionized water so that a pixel electrode 24 is formed on the substrate 1. The pixel electrode 24 is connected with the drain electrode 16 through the passivation layer via hole 18. In the above process, the fifth etching pattern formed by the fifth etchant on the transparent conductive film and the film pattern of pixel electrode 24 are complementary patterns, that is, the pixel electrode 24 is formed in the region other than that of the fifth etchant. Because of the surface tension of the fifth etchant, the fifth etchant is expanded on the substrate 1, and therefore the fifth etching pattern is smaller than the actively etched region. If corrosive liquid is used as the fifth etchant, the distance from the edge of the fifth etching pattern to the corresponding edge of the pixel electrode 24 is about 30 μm~50 μm; if corrosive paste is used as the fifth etchant, the distance from the edge of the fifth etching pattern to the corresponding edge of the pixel electrode 24 is about 10 μm~30 μm.

The pixel electrode formed in the TFT-LCD array substrate generally has a relatively large size. In view of the expanding degree of the fifth etchant, the efficiency of the inkjet print device and the structure of the pixel electrode, the following parameters are preferably employed in this embodiment. When corrosive liquid with a wettability contact angle of 45 degree~60 degree is employed, the inkjet print device preferably employs an electrostatic inkjet print head, the diameter of the nozzle preferably is 10 μm~40 μm, more preferably 20 μm. When corrosive paste with a wettability contact angle of 60 degree~90 degree is employed, the inkjet print device preferably employs an ultrasonic inkjet print head, the diameter of the nozzle preferably is 30 μm~60 μm, more preferably 40 μm.

A second embodiment of a method of forming a film pattern of micro-structure according to the invention comprises the following steps.

Step 21, jetting or dropping solution for forming a film pattern in a predetermined ink pattern on a substrate by an inkjet print device; and Step 22, drying the solution to form the film pattern on the substrate.

Figure 7A:
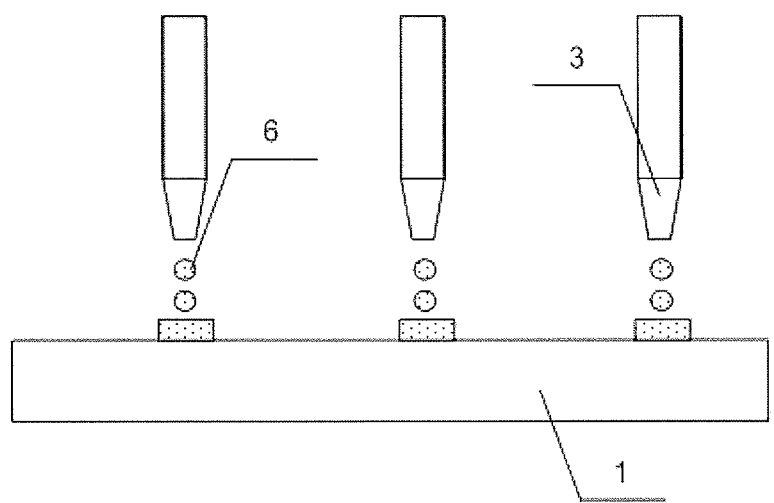
FIG. 7 is a schematic view showing a second embodiment of a manufacture process according to the invention.
Figure 7B:
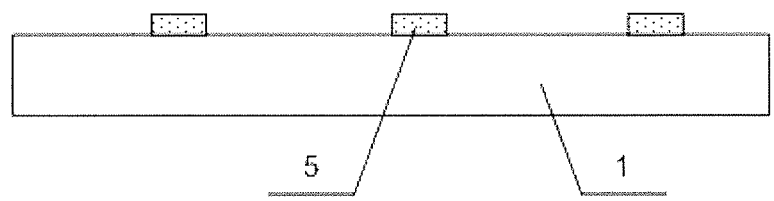

FIG. 7 is a schematic view showing a second embodiment of a manufacture process according to the invention. Firstly, the solution 6 for forming a film pattern is jetted or dropped on the substrate 1 in a predetermined ink pattern by the inkjet print device 3, as shown in FIG. 7a. Then, the solution is dried to form the film pattern 5 on the substrate 1, as shown in FIG. 7b.

In this embodiment, the substrate 1 may be a transparent substrate such as a glass substrate, a quartz substrate and the like, or a flexible substrate or a semiconductor substrate. The inkjet print device in this embodiment is similar as that in the first embodiment except that the diameter of the nozzle is about 5 μm~50 μm. The solution may be liquid or colloid formed by mixing particles with solvent. The particles may be nano particles of nitride silicon, silicon dioxide, amorphous silicon, a metal, or a metal oxide. The solvent may be inorganic, organic or macromolecular solvent. In addition, the physical and chemical properties of the solution have a great influence on the film pattern to be formed as in the first embodiment. In this embodiment, the viscosity of the solution is smaller than 20 mPa·s, the surface tension of the solution is 20 mN/m~400 mN/m, and the wettability contact angle is about 60 degree~90 degree.

In this embodiment, the size of ink pattern formed by the inkjet print device is smaller than that of the actively formed film pattern. The solution dropped on the substrate is expanded because of the surface tension thereof, and thus it is necessary to leave an expanding region for the solution. If a kind of solution in the form of liquid is employed, the distance from the edge of the ink pattern to the corresponding edge of the film pattern to be formed is about 30 μm~50 μm; if a kind of solution in the form of colloid is employed, the distance from the edge of the ink pattern to the corresponding edge of the film pattern to be formed is about 10 μm~30 μm. That is, in this embodiment, the size of the film pattern to be formed is larger than that of the ink pattern initially formed by the solution, and the ink pattern is expanded by 30 μm~50 μm or 10 μm~30 μm to form the film pattern.

In this embodiment, during forming the film pattern, the substrate may be heated to 30° C.~200° C. to accelerate the drying process. Such heating process may be accomplished by a laser heating method, an infrared heating method, or a resistance heating method.

Hereinafter, the second embodiment of the method of manufacturing the film pattern of micro-structure according to the invention will be applied to manufacture the TFT-LCD array substrate. It should be noted that, the solution for forming each film pattern may be jetted by the print head in a piezoelectric manner, an electrostatic manner, an ultrasonic manner, a thermal bubble manner and the like, and the diameter of the nozzle is about 5 μm~50 μm. During forming each film pattern, the substrate may be heated to 30° C.~200° C. to accelerate the evaporation of the inorganic, organic or macromolecular solvent while the solute in the solution is remained.

Firstly, a first solution for forming a film pattern is jetted by the inkjet print device to form the first ink pattern on the substrate. The first solution may be suspending liquid comprising nano particles of a metal such as Cu, Al, Ag, Au, Ni or Pt. The suspending liquid may be formed by mixing the above metal nano particles into inorganic, organic or macromolecular solvent. The gate electrode, the gate line and the storage electrode are formed on the substrate by drying the first solution, as shown in FIG. 2b. Because of the surface tension of the first solution, the first solution is expanded on the substrate, and therefore the first ink pattern initially formed by the first solution is smaller than the actively formed film pattern, that is, the pattern of the gate electrode, the gate line and the storage electrode is larger than the first ink pattern by 5 μm~30 μm. In view of the expanding degree of the first solution, the efficiency of the inkjet print device and the structure of the gate line, the following parameters are preferably employed in this embodiment: when suspending liquid with a wettability contact angle of 75 degree~90 degree is employed, the inkjet print device preferably employs an electrostatic inkjet print head, the diameter of the nozzle preferably is 5 μm~20 μm.

Then, second solution for forming a film pattern is jetted on the substrate with the gate electrode, the gate line and the storage electrode by the inkjet print device. The second solution may be suspending liquid comprising nano particles of silicon nitride or silicon dioxide. The suspending liquid may be formed by mixing the above nano particles into inorganic, organic or macromolecular solvent. In addition, the organic solvent may comprise vinylphenol, benzocyclobutene, polyimide or derivatives thereof. By heating the substrate to 30° C.~200° C., the gate insulating film covering the entirety of the substrate is formed on the substrate. Then, third solution for forming a film pattern is jetted on the substrate with the gate insulating film by the inkjet print device to form the second ink pattern on the substrate. The third solution may be suspending liquid comprising nano particles of amorphous silicon. The suspending liquid may be formed by mixing the above nano particles into inorganic, organic or macromolecular solvent. In addition, the organic solvent may comprise pentacene, polyacrylonitrile, polyanthrylene, polyphthalocyanine, triazole or derivatives thereof. By heating the substrate, the active layer is formed. The active layer is formed on the gate insulating film and positioned above the gate electrode as shown in FIG. 3b. Because of the surface tension of the third solution, the third solution is expanded on the substrate, and therefore the second ink pattern initially formed by the third solution is smaller than the actively formed film pattern, that is, the pattern of the active layer is larger than the second ink pattern by 5 μm~30 μm. In view of the expanding degree of the third solution, the efficiency of the inkjet print device and the structure of the active layer, the following parameters are preferably employed in this embodiment: when suspending liquid with a wettability contact angle of 60 degree~90 degree is employed, the inkjet print device preferably employs an ultrasonic inkjet print head, the diameter of the nozzle preferably is 20 μm~50 μm.

Then, fourth solution for forming a film pattern is jetted on the substrate with the active layer by the inkjet print device to form the third ink pattern on the substrate. The fourth solution may be suspending liquid comprising nano particles of metal such as Cu, Al, Ag, Au, Ni or Pt. The suspending liquid may be formed by mixing the above metal nano particles into inorganic, organic or macromolecular solvent. By heating the substrate, the data line, the source electrode and the drain electrode are formed as shown in FIG. 4b. Because of the surface tension of the fourth solution, the fourth solution is expanded on the substrate, and therefore the third ink pattern initially formed by the fourth solution is smaller than the actively formed film pattern, that is, the pattern of the date line, the source electrode and the drain electrode is larger than the third ink pattern by 5 μm~30 μm. In view of the expanding degree of the fourth solution, the efficiency of the inkjet print device and the structure of the TFT channel region, the following parameters are preferably employed in this embodiment: when suspending liquid with a wettability contact angle of 60 degree~90 degree is employed, the inkjet print device preferably employs an ultrasonic inkjet print head, the diameter of the nozzle preferably is 5 μm~10 μm.

Then, fifth solution for forming a film pattern is jetted on the substrate with the data line, the source electrode and the drain electrode by the inkjet print device to form the fourth ink pattern on the substrate. The fifth solution may be suspending liquid comprising nano particles of silicon nitride or silicon dioxide. The suspending liquid may be formed by mixing the above nano particles into inorganic, organic or macromolecular solvent. In addition, the organic solvent may comprise vinylphenol, benzocyclobutene, polyimide or derivatives thereof. By heating the substrate, the passivation layer with via hole is formed as shown in FIG. 5b. Because of the surface tension of the fifth solution, the fifth solution is expanded on the substrate, and therefore the fourth ink pattern initially formed by the fifth solution is smaller than the actively formed film pattern, that is, the pattern of the passivation layer with via hole is larger than the fourth ink pattern by 5 μm~30 μm. In view of the expanding degree of the fifth solution, the efficiency of the inkjet print device and the structure of the passivation layer with via hole, the following parameters are preferably employed in this embodiment: when suspending liquid with a wettability contact angle of 60 degree~90 degree is employed, the inkjet print device preferably employs an ultrasonic inkjet print head, the diameter of the nozzle preferably is 15 μm~25 μm.

Finally, sixth solution for forming a film pattern is jetted on the substrate with the passivation layer via hole by the inkjet print device to form the fifth ink pattern on the substrate. The sixth solution may be suspending liquid comprising nano particles of tin oxide, indium tin oxide, indium zinc oxide or other transparent conductive metal oxides. The suspending liquid may be formed by mixing the above nano particles into inorganic, organic or macromolecular solvent. The pixel electrode is formed on the substrate by drying the sixth solution, and the pixel electrode is connected with the drain electrode through the passivation layer via hole, as shown in FIG. 6b. Because of the surface tension of the sixth solution, the sixth solution is expanded on the substrate, and therefore the fifth ink pattern initially formed by the sixth solution is smaller than the actively formed film pattern, that is, the pattern of the pixel electrode is larger than the fifth ink pattern by 5 μm~30 μm. In view of the expanding degree of the sixth solution, the efficiency of the inkjet print device and the structure of the pixel electrode, the following parameters are preferably employed in this embodiment: when suspending liquid with a wettability contact angle of 60 degree~90 degree is employed, the inkjet print device preferably employs an ultrasonic inkjet print head, the diameter of the nozzle preferably is 30 μm~50 μm.

A third embodiment of a method of forming a film pattern of micro-structure according to the invention comprises the following steps.

Step 31, jetting or dropping a thin film on a substrate by an inkjet print device;

Step 32, jetting or dropping etchant in a predetermined etching pattern on the thin film by an inkjet print device;

Step 33, etching the thin film by the etchant; and

Step 34, cleaning the thin film to form a film pattern on the substrate.

This embodiment is a modification of the first embodiment. This embodiment differs from the first embodiment in that the thin film on the substrate is also formed by an inkjet print device. The processes of jetting or dropping solution and forming a film pattern have been described in the second embodiment, and the details thereof is omitted here for simplicity.

The above embodiments according to the invention can be combined to manufacture a TFT-LCD array substrate, a diode or other device in the integrated circuit, and therefore the method of manufacturing the film pattern with micro-pattern according to this invention can be widely used. Some examples of the combinations of the above embodiments will be described below by taking formation of a TFT-LCD as an example.

A first example for manufacturing a TFT-LCD array substrate in which the embodiments of the method of manufacturing the film pattern of micro-structure according to the invention are applied comprises the following steps.

Step 101, depositing a gate metal film on a substrate by a magnetron sputtering method, a vacuum sputtering method or a thermal evaporation method, jetting an etching pattern of an etchant on the gate metal film by an inkjet print device, and forming a gate electrode, a gate line and a storage electrode on the substrate by a heating process and a washing process;

Step 102, jetting a gate insulating film on the substrate after the Step 101, jetting an ink pattern of a semiconductor film on the gate insulating film, and curing the ink pattern to form an active layer;

Step 103, depositing a source/drain metal film on the substrate after the Step 102 by a magnetron sputtering method, a vacuum sputtering method or a thermal evaporation method, jetting an etching pattern of an etchant on the source/drain metal film by an inkjet print device, and forming a data line, a source electrode and a drain electrode by a heating process and a washing process;

Step 104, jetting an ink pattern of a passivation film on the substrate after the Step 103 by an inkjet print device, and curing the ink pattern to form a passivation layer with via hole;

Step 105, depositing a transparent conductive film on the substrate after the Step 104 by a magnetron sputtering method, a vacuum sputtering method or a thermal evaporation method, jetting an etching pattern of an etchant on the transparent conductive film by an inkjet print device, and forming a pixel electrode by a heating process and a washing process.

In the above example, both the gate insulating film and the semiconductor film formed by the inkjet print device may employ various materials. For example, the semiconductor film may be formed by an organic semiconductor material or conventional amorphous silicon, that is, the semiconductor film may be formed by the inkjet print device with the solution of organic semiconductor material as the ink or with the solution of silicon nano particles as the ink. In addition, for example, the gate insulating film may be formed by silicon nitride, silicon dioxide or polymers such as vinylphenol, benzocyclobutene, polyimide and the like, that is, the gate insulating film may be formed by the inkjet print device with the suspending liquid of silicon nitride or silicon dioxide nano particles as the ink or with the solution of the macromolecular material as the ink. Therefore, in response to the market demand, the materials can be selected to form thin film transistors with different characteristics and displays with different resolutions. For example, the mobile display with a low resolution may be formed by the organic semiconductor material with low mobility while the liquid crystal display with a high resolution may be formed by the amorphous silicon with a high mobility. Therefore, the material and cost for different displays can be optimized.

A second example for manufacturing the TFT-LCD array substrate in which the embodiments of the method of manufacturing the film pattern of micro-structure according to the invention are applied comprises the following steps.

Step 201, jetting an ink pattern of a gate metal film on a substrate by an inkjet print device, and curing the ink pattern to form a gate electrode, a gate line and a storage electrode;

Step 202, sequentially depositing a gate insulating film and a semiconductor film on the substrate after the Step 202, jetting an etching pattern of an etchant on the semiconductor film by an inkjet print device, and forming an active layer by a heating process and a washing process;

Step 203, jetting an ink pattern of a source/drain metal film on the substrate after the Step 202 by an inkjet print device, and curing the ink pattern to form a data line, a source electrode and a drain electrode;

Step 204, depositing a passivation film on the substrate by a PECVD method after the Step 203, jetting an etching pattern of an etchant on the passivation layer by an inkjet print device, and forming a passivation layer with via hole by a heating process and a washing process; and Step 205, jetting an ink pattern of a transparent conductive film on the substrate after the Step 204, and curing the ink pattern to form a pixel electrode.

In this example, the gate insulating film, the source/drain metal film and the transparent conductive film formed by the inkjet print device may employ various materials. For example, the gate metal film and the source/drain metal film may be formed by a conductive polymer material, such as polythiophene, polyaniline, poly(3,4-ethylenedioxythiophene), poly(p-phenylenevinylenes) copolymer and the like, or a conventional metal material such as Cu, Al, Ag, Au, Ni or Pt or alloys thereof, that is, the gate metal film and the source/drain metal film may be formed by the inkjet print device with the solution of conductive macromolecular material as the ink or with the solution containing metal nano particles as the ink. In addition, for example, the transparent conductive film may be formed by tin oxide, indium tin oxide, indium zinc oxide or other transparent conductive oxide, that is, the transparent conductive film may be formed by the inkjet print device with the solution of transparent conductive oxide as the ink. Therefore, in response to the market demand, the materials can be selected to form thin film transistors with different characteristics and displays with different resolutions. For example, the mobile display with a low resolution may be formed by the conductive macromolecular material with a high resistivity while the liquid crystal display with a high resolution may be formed by the metal material with a low resistivity. Therefore, the material and cost for different displays can be optimized.

The above two examples merely are given as examples of combining the embodiments of the method of manufacturing the film pattern with micro-pattern. In practice, the first to third embodiments of the method of manufacturing the film pattern with micro-pattern according to the invention may be combined in other ways and the details thereof are omitted here for simplicity.

Figure 8:
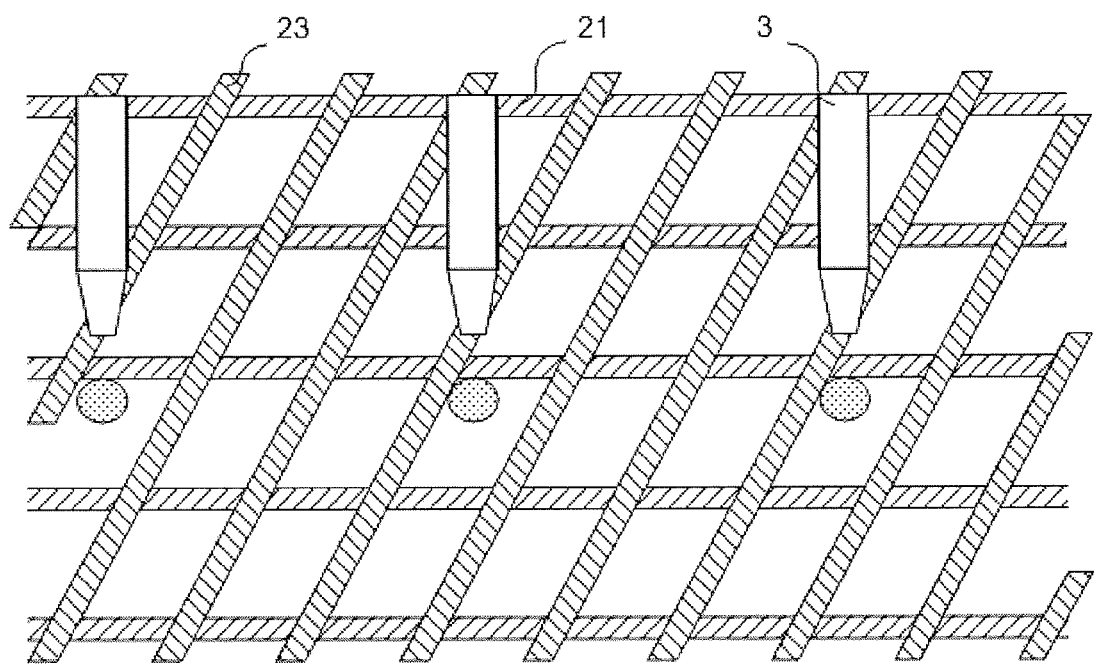
FIG. 8 is a schematic view showing a manufacture process of a TFT-LCD array substrate in which a method of forming a film pattern of micro-structure according to the invention is applied.

FIG. 8 is a schematic view showing a manufacture process of a TFT-LCD array substrate in which the method of manufacturing the thin film pattern of micro-structure according to the invention is applied.

As shown in FIG. 8, the gate line 21 and the data line 23 are formed on the substrate, and the thin film transistor and the pixel electrode are formed in each pixel region defined by the gate line 21 and the data line 23. As described above, the ink is jetted or dropped by the inkjet print device 3 in FIG. 8, and the ink comprising the solution for forming a film pattern or the etchant. In addition to the above-described size of the nozzle and the properties of the ink, the precision of the ink pattern or etching pattern also relates to the movement speed of the workbench, the movement speed of the print head, the temperature of the substrate and the like.

A positioning mark may be provided on the substrate to improve the positioning accuracy. For example, the print head employs the mark on the substrate to determine the jetting position of the ink. The positioning mark for the source and drain electrodes is formed in the region of the active layer, and the positioning mark for the pixel electrode is formed in the region of the passivation layer and the drain electrode. In this way, the size precision and positioning accuracy of the film pattern of micro-structure formed by the method according to the invention can be improved.

One or more pint heads may be employed to form the structural layers of the TFT-LCD array substrate. For example, the ink containing metal material particles is jetted or dropped by a print head with a certain size and shape to form the gate line and the gate electrode, or to four the data line, the drain electrode and the source electrode; the ink containing insulating material or semiconductor material is jetted or dropped by a print head with another size and shape to form the gate insulating film, the passivation film or the active layer. Since the thicknesses of the structural layers are different from one another, the consumption amount of the solution for forming a film pattern varies, and thus the size of the nozzle varies. Generally, the print head with large-sized nozzles is used to form the thick structural layer while the print head with small-sized nozzles is used to form thin structural layer. In addition, one or more print heads may be employed to jet the etchant so that the structural layers of the TFT-LCD array substrate are formed. For example, the ink containing the component capable of etching the metal film is jetted or dropped by a print head with a certain size and shape to form the gate line and the gate electrode, or to form the data line, the source electrode and the drain electrode; the ink containing the component capable of etching the gate insulating film or the semiconductor film is jetted or dropped by a print head with another shape and size to form the gate insulating film, the passivation film and the active layer. Since the thicknesses of the structural layers are different from one another, the size of the nozzle varies. Generally, the print head with large-sized nozzles is used to form the thick structural layer while the print head with small-sized nozzles is used to form thin structural layer. In addition, the size of the nozzle relates to that of the structural layer. Generally, the nozzle of a large size is used to form the structural layer of a large size while the nozzle of a small size is used to form the structural layer of a small size. In order to shorten the process period and improve the efficiency, more than two print heads may be installed in one print cartridge, and more than two print cartridges may be installed in one inkjet print device. The number and pitch of the print cartridges or print heads relate to the structural layers.

In addition, in the above TFT-LCD array substrate formed according to the embodiment of the invention, the bottom gate type thin film transistor is employed. However, the TFT-LCD array substrate formed according to the invention can also employ the top gate type thin film transistor.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method of forming a film pattern with micro-pattern, comprising:
    Step 11 of depositing a thin film on a substrate;
    Step 12 of jetting or dropping etchant on the thin film with a predetermined etching pattern by an inkjet print device;
    Step 13 of etching the thin film by the etchant; and
    Step 14 of cleaning the thin film to form a film pattern on the substrate, wherein in the Step 12, the viscosity of the etchant is smaller than 20 mPa·s, the surface tension of the etchant is 20 mN/m~400 mN/m, and the wettability contact angle of the etchant is 60 degree~90 degree, and wherein the film pattern and the etching pattern are complementary patterns, a distance from an edge of the etching pattern to a corresponding edge of the film pattern is 30 μm~50 μm when the etchant is corrosive liquid, and the distance from the edge of the etching pattern to the corresponding edge of the film pattern is 10 μm~30 μm when the etchant is corrosive paste.

2. The method according to claim 1, wherein in the Step 11, the thin film is deposited on the substrate, or the thin film is formed on the substrate by ink jetting or dropping.

3. The method according to claim 1, wherein in the Step 13, the substrate is heated to 30° C.~80° C.

4. The method according to claim 1, wherein in the Step 12, the inkjet print device comprises a print heat with a nozzle, and the diameter of the nozzle is 5 μm~100 μm.

5. A method of forming a film pattern with micro-pattern, comprising:
    Step 21 of jetting or dropping solution for forming the film pattern in a predetermined ink pattern on a substrate by an inkjet print device; and
    Step 22 of drying the solution to form the film pattern on the substrate,
    wherein the viscosity of the solution is smaller than 20 mPa·s, the surface tension of the solution is 20 mN/m~400 mN/m, the wettability contact angle of the solution is 60 degree~90 degree, and the solution is liquid or colloid, which is formed by mixing particles with a solvent, and wherein the ink pattern is smaller than the film pattern, a distance from an edge of the ink pattern to a corresponding edge of the film pattern is 30 μm~50 μm when the solution is liquid, and the distance from the edge of the ink pattern to the corresponding edge of the film pattern is 10 μm~30 μM when the solution is colloid.

6. The method according to claim 5, wherein in the Step 21, the inkjet print device comprises a print heat with a nozzle, and the diameter of the nozzle is 5 μm~50 μm.

7. The method according to claim 5, wherein in the Step 22, the substrate is heated to 30° C.~200° C. to dry the solution.

8. A method of manufacturing a thin film transistor liquid crystal display (TFT-LCD) array substrate, wherein a plurality of structural layers of the array substrate are formed on a substrate by an inkjet print device, wherein the plurality of structural layers comprises a structural layer of a gate electrode and a gate line, a structural layer of an active layer, a structural layer of a source electrode and a drain electrode, a structural layer of a passivation layer, and a structural layer of a pixel electrode, wherein the step of forming the structural layer of the gate electrode and the gate line comprises: jetting an ink pattern of a gate metal film on the substrate by the inkjet print device, and curing the ink pattern to form the gate electrode and the gate line, and wherein the ink pattern is smaller than the gate electrode and the gate line, the gate electrode and the gate line are larger than the ink pattern by 5 μm~30 μm, when suspending liquid with a wettability contact angle of 75 degree~90 degree is employed, the inkjet print device employs an electrostatic inkjet print head, the diameter of the nozzle is 5 μm~20 μm.

9. The method according to claim 8, wherein the step of forming the structural layer of the gate electrode and the gate line comprises: depositing a gate metal film on the substrate, jetting an etching pattern of etchant on the gate metal film by the inkjet print device, and forming the gate electrode and the gate line on the substrate by a washing process.

10. The method according to claim 8, wherein the step of forming the structural layer of the active layer comprises: depositing a semiconductor film on the substrate, jetting an etching pattern of an etchant on the semiconductor film by the inkjet print device, and forming the active layer by a washing process.

11. The method according to claim 8, wherein the step of forming the structural layer of the active layer comprises: jetting an ink pattern of a semiconductor film on the substrate, and curing the ink pattern to form the active layer.

12. The method according to claim 8, wherein the step of forming the structural layer of the source electrode and the drain electrode comprises:

depositing a source/drain metal film on the substrate, jetting an etching pattern of an etchant on the source/drain metal film by the inkjet print device, and forming the data line, the source electrode and the drain electrode by a washing process.

13. The method according to claim 8, wherein the step of forming the structural layer of the source electrode and the drain electrode comprises: jetting an ink pattern of a source/drain metal film on the substrate by the inkjet print device, and curing the ink pattern to form the data line, the source electrode and the drain electrode.

14. The method according to claim 8, wherein the step of forming the structural layer of the passivation layer comprises: depositing a passivation film on the substrate, jetting an etching pattern of an etchant on the passivation layer by the inkjet print device, and forming a passivation layer with via hole by a washing process.

15. The method according to claim 8, wherein the step of forming the structural layer of the passivation layer comprises: jetting an ink pattern of a passivation layer on the substrate by the inkjet print device, and curing the ink pattern to form the passivation layer with via hole.

16. The method according to claim 8, wherein the step of forming the structural layer of the pixel electrode comprises: depositing a transparent conductive film on the substrate, jetting an etching pattern of an etchant on the transparent conductive film by the inkjet print device, and forming the pixel electrode by a washing process.

17. The method according to claim 8, wherein the step of forming the structural layer of the pixel electrode comprises: jetting an ink pattern of a transparent conductive film on the substrate, and curing the ink pattern to form the pixel electrode.

18. The method according to claim 8, the TFT-LCD array substrate further comprises a gate insulating film, the gate insulating film is formed by deposition, or the gate insulating film is formed by in jetting or dropping.

* * * * *